United States Patent [19]
Osawa et al.

[11] Patent Number: 6,077,727
[45] Date of Patent: Jun. 20, 2000

[54] METHOD FOR MANUFACTURING LEAD FRAME

[75] Inventors: Kenji Osawa; Makoto Ito, both of Kanagawa, Japan

[73] Assignee: Sony Corporation, Tokyo, Japan

[21] Appl. No.: 08/786,285

[22] Filed: Jan. 22, 1997

[30] Foreign Application Priority Data

Jan. 31, 1996 [JP] Japan ..................................... 8-035730

[51] Int. Cl.[7] .................................................. H01L 21/44
[52] U.S. Cl. .......................... 438/123; 438/111; 438/112; 438/123; 438/124; 438/127; 257/673; 257/676; 257/690; 257/766; 257/781; 257/787
[58] Field of Search .................................... 438/111, 112, 438/123, 124, 127; 257/673, 781, 676, 690, 766, 787

[56] References Cited

U.S. PATENT DOCUMENTS

| | | | |
|---|---|---|---|
| 3,773,628 | 11/1973 | Misawa et al. | 205/122 |
| 4,736,236 | 4/1988 | Butt | 257/672 |
| 5,116,459 | 5/1992 | Kordus et al. | 156/631 |
| 5,221,428 | 6/1993 | Ohsawa et al. | 156/652 |
| 5,349,238 | 9/1994 | Ohsawa et al. | 257/736 |
| 5,437,764 | 8/1995 | Ohsawa et al. | 216/14 |
| 5,882,955 | 3/1999 | Huang et al. | 438/111 |
| 5,937,278 | 8/1999 | Ito et al. | 438/123 |

FOREIGN PATENT DOCUMENTS

| | | |
|---|---|---|
| 55-26613 | 2/1980 | Japan. |
| 3-268340 | 11/1991 | Japan. |
| 5-326783 | 12/1993 | Japan. |
| 7-183441 | 7/1995 | Japan. |

*Primary Examiner*—Olik Chaudhuri
*Assistant Examiner*—Alonzo Chambliss
*Attorney, Agent, or Firm*—Ronald P. Kananen; Rader, Fishman & Grauer

[57] ABSTRACT

There is provided a method for manufacturing a lead frame which can easily manufacture a high quality lead frame.

A pattern layer is selectively formed on a copper plate and the surface of the substrate having formed this pattern layer is then plated with gold to form a gold layer using the pattern layer as the mask. Next, the gold layer is then plated with copper to form a copper layer, thereby forming a fine lead consisting of two layers of gold layer and copper layer. Thereafter, the pattern layer is selectively removed, an insulated resist film is formed and the copper plate is etched. In this case, the gold layer is used as the etching stop layer. Thereby, the lead frame having the fine lead of double-layer structure can be formed.

9 Claims, 5 Drawing Sheets

METHOD FOR MANUFACTURING LEAD FRAME

BACKGROUND OF THE INVENTION

1. Field of the Invention

The present invention relates to a method for manufacturing lead frame having fine leads to be connected electrically to a semiconductor element and particularly to a method for manufacturing lead frame where at least those to be connected electrically to a semiconductor element among the fine leads provided thereto have the structure of two or more layers.

2. Description of Related Art

A lead frame of this type has been manufactured to have the fine lead to be connected electrically with a semiconductor element (chip) which includes a contact area having the layer structure composed of copper (Cu) layer and gold (Au) layer for the contact with the semiconductor element. This lead frame has been manufactured by plating the fine leads of copper with gold or by forming gold bump (projected connecting electrode) to the copper fine lead.

In the method for plating the copper fine lead with gold, after a copper foil 42 is bonded to a polyimide tape 41 with a bonding agent as shown in FIG. 8A, this copper foil 42 is selectively removed by the etching process to form a fine lead 43 as shown in FIG. 8B. Thereafter, the surface of fine lead 43 is plated with gold layer 44 as shown in FIG. 8C.

Meanwhile, in the method for forming gold bump to a copper fine lead, after a fine lead 54 is formed, as shown in FIG. 9A, by plating, with copper, the surface of a copper plate 53 having formed aluminum (Al) film 51 and copper film 52 on the surface thereof, the fine lead 54 is covered with an insulated film 55 and the copper plate 53 is selectively removed by the etching process with the aluminum film 51 used as the etching stop layer as shown in FIG. 9B. Next, the aluminum film 51 and copper film 52 are selectively removed by the etching process as shown in FIG. 9C and thereafter a bump 56 is formed by evaporating gold at the end part of the fine lead 54 as shown in FIG. 9D.

However, the method of plating the fine lead with gold explained above forms a fine lead 43 by etching the copper foil 42. Accordingly, a cross-sectional area of the fine lead 43 becomes small due to generation of side etching and strength of fine lead 43 becomes remarkably weak. Therefore, this method has a problem that the fine lead 43 is easily bent at the time of forming the gold layer 44 through the plating of gold.

On the other hand, the method for forming gold bump onto the fine lead has a problem that a longer time is required for evaporation and the manufacturing process is not continuous resulting in bad manufacturing efficiency because the gold bump 56 is formed by the evaporation method. Moreover, this method also has a problem that manufacturing cost becomes high because a large number of jigs are required, in addition to the problem that it is difficult to keep the thickness of bump 56 to 3 μm or more and to improve the quality because accuracy of film thickness is low.

SUMMARY OF THE INVENTION

The present invention has been proposed considering such problems of the related art and it is therefore an object of the present invention to provide a method for manufacturing lead frame to easily and economically manufacture the lead frame having improved quality.

The method for manufacturing a lead frame of the present invention is the method for manufacturing the lead frame where fine leads are electrically connected to electrodes of a semiconductor chip and at least those to be electrically connected to the semiconductor chip among the fine leads have the structure of two or more layers, comprising a process to form a pattern layer used as a mask for metal plating on a substrate and a process to form fine leads having structure of two or more layers on the surface of substrate in the side where the pattern layer is formed by forming two or more layers by sequentially plating the surface with two or more metals using the pattern layer as the mask.

Moreover, the method for manufacturing a lead frame of the present invention also comprises the process to remove a pattern layer after formation of fine leads and subsequently cover the region except for at least the electrically connecting part with an insulated film and the process to selectively remove the substrate by etching process using the layer placed in the direct contact with the substrate among a plurality of layers of the fine leads as the etching stop layer.

Moreover, the method for manufacturing a lead frame further comprises, in addition to the processes to form a pattern layer and to form fine leads, when the substrate has the layer structure consisting of a plurality of layers, the process to remove the pattern layer, after the fine leads are formed, and subsequently cover the region except for at least electrical connecting part of the fine leads with an insulated film, the process for selectively removing a part of the substrate by etching it using one layer of the substrate as the etching stop layer, and the process to selectively remove, after a part of the substrate is selectively removed, the layer used as the etching stop layer.

In the method for manufacturing a lead frame of the present invention, after a pattern layer is formed selectively on the substrate, the surface of the substrate in the side where the pattern layer is formed is respectively plated with two or more kinds of metal materials using the pattern layer as the mask. Thereby, the fine leads having the structure consisting of two or more layers can be formed.

BRIEF DESCRIPTION OF THE DRAWINGS

Other objects and advantages of the present invention will be apparent from the following detailed description of the presently preferred embodiments thereof, which description should be considered in conjunction with the accompanying drawings in which.

DETAILED DESCRIPTION OF THE PREFERRED EMBODIMENTS

The preferred embodiments of the present invention will be explained in detail with reference to the accompanying drawings.

FIGS. 1A to 1F are cross-sectional views of each process in the method for manufacturing a lead frame in relation to the first embodiment of the present invention.

Figure 1A:
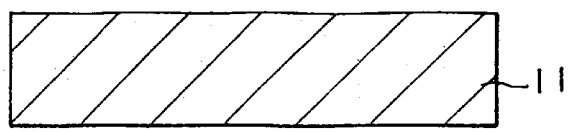
FIGS. 1A to 1F are process diagrams for explaining the method for manufacturing a lead frame in relation to the first embodiment of the present invention.

In this embodiment, a copper plate 11, for example, in the thickness of about 150 is used as the substrate to manufacture the lead frame by the plating process as shown in FIG. 1A.

Figure 1B:
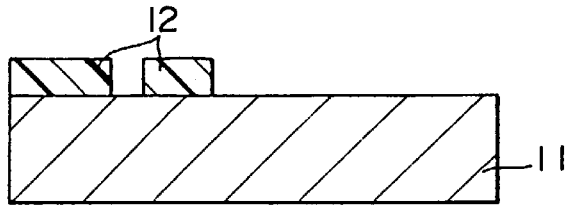

Next, as shown in FIG. 1B, the copper plate 11 is coated with photoresist film and this film is then patterned through the selective exposure to form a pattern layer 12. In this case, as the photoresist material, an electrolytically deposited resist, for example, is used and this photoresist film is formed in the thickness, for example, of 10 to 30 $\mu$m. Moreover, the photoresist film has been exposed with the exposure process, for example, of 150 to 400 mj/cm$^2$ and can also be developed by the spraying using the 1% solution (45° C.) of $Na_2CO_3$.

Figure 1C:
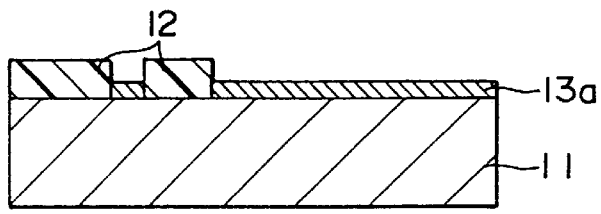

After formation of the pattern layer 12, the surface of the copper plate 11 in the side where the pattern layer 12 is formed is plated with gold using the pattern layer 12 as the mask to form a gold layer 13a, for example, in the thickness of 0.1 to 5 $\mu$m as shown in FIG. 1C. In this case, as the plating solution, the no-cyan based plating solution, for example, is used. Moreover, current density has been set to 0.05 A/dm$^2$ and temperature to 40° C. for the electric plating.

Figure 1D:
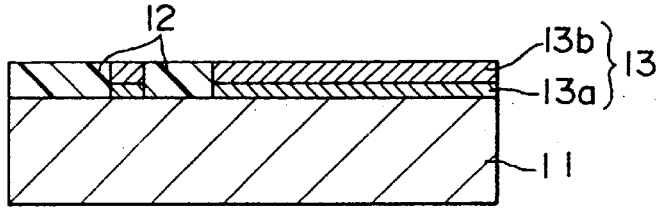

After formation of the gold layer 13a, this gold layer 13 is plated with copper to form a copper layer 13b, for example, in the thickness of 5 to 30 $\mu$m in view of forming a fine lead 13 consisting of two layers of gold layer 13a and copper layer 13b as shown in FIG. 1D. In this case, as the plating solution, the solution obtained by mixing copper sulfate ($CuSO_4$) of 80 g/l, sulfuric acid ($H_2SO_4$) of 200 g/l and hydrochloric acid ion (Cl$^-$) of 50 ppm is used and a current density is set to 1.0 to 4.0 A/dm$^2$ for the electric plating.

Figure 1E:
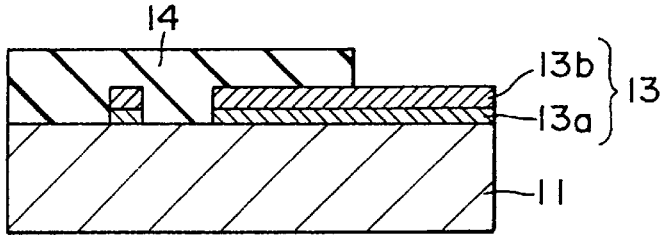

After formation of the copper layer 13b, the pattern layer 12 is removed and the insulated resist film 14 is selectively formed, except for the end part of the fine lead 13, on the copper plate 11 where fine lead 13 is formed as shown in FIG. 1E.

After formation of the insulated resist film 14, the copper plate 11 is selectively etched from the side opposed to the surface where the insulated resist film 14 is formed. This etching is executed in such a manner that the solution obtained by mixing the solution of hydrogen peroxide ($H_2O_2$) of 10 to 20% and solution of sulfuric acid ($H_2SO_4$) of 10 to 18% is used as the plating solution and this solution is sprayed after it is heated up to 45° C. In this case, as the etching stop layer, the gold layer 13a is used.

Figure 1F:
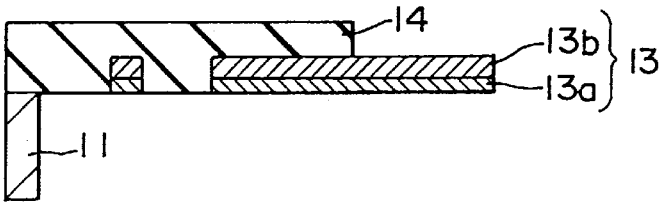

Thereby, the lead frame having the fine leads 13 consisting of two layers, one surface is formed of gold layer 13a while the other surface is formed of copper layer 13b and is partly isolated electrically can be formed as shown in FIG. 1F.

Figure 2:
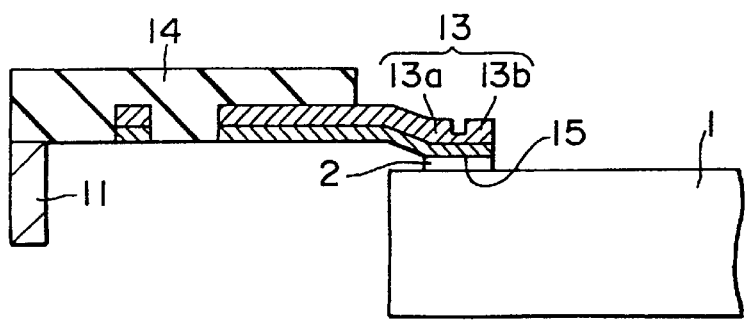
FIG. 2 is a cross-sectional view for explaining application condition of the lead frame manufactured by the method shown in FIGS. 1A to 1F.

The lead frame manufactured as explained above can be used, as shown in FIG. 2, in such a manner that the connecting part 15 at the end portion of the fine lead 13 is placed in contact and connected electrically with an ultrasonic tool or the like to the electrode pad 2 provided on a semiconductor chip 1 like an LSI (Large Scale Integration), etc. In this case, the fine lead 13 is placed in contact with the electrode pad 13 through the gold layer 13a.

According to the method for manufacturing a lead frame in relation to this embodiment of the present invention, the surface of the copper plate 11 in the side where the pattern layer 12 is formed is plated, after plating by gold to form a gold layer 13a, with copper to form a copper layer 13b. Thereby, the fine lead 13 having a two-layer structure, where one surface is formed of the gold layer 13a and the other surface is formed of the copper layer 13b, can be formed easily.

Figure 8A:
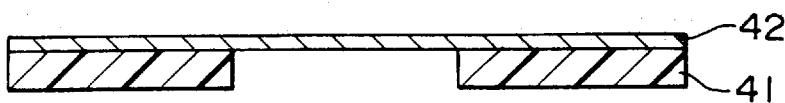
FIGS. 8A to 8C are process diagrams for explaining the method of the related art for manufacturing a lead frame.
Figure 8B:
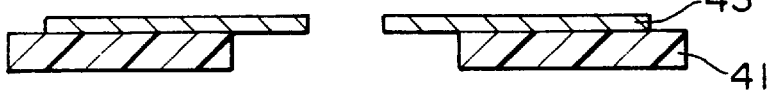
Figure 8C:
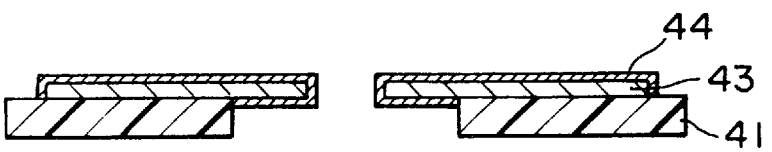
Figure 9A:
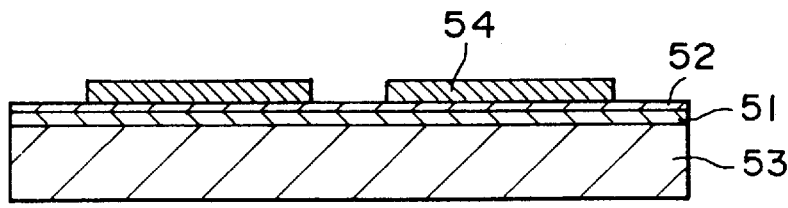
FIGS. 9A to 9D are process diagrams for explaining the method of the related art for manufacturing the other lead frame.
Figure 9B:
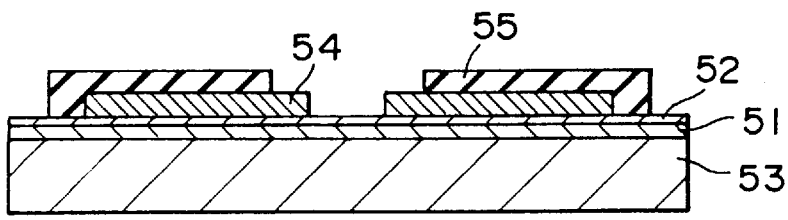
Figure 9C:
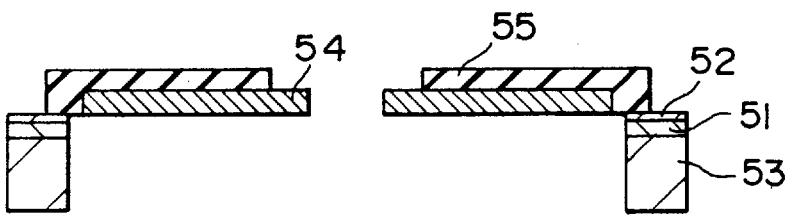
Figure 9D:
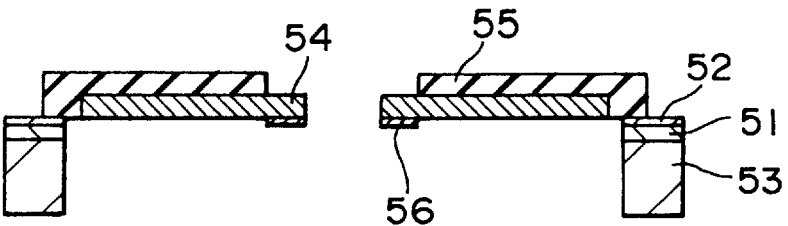

That is, like the method of the related art for plating the fine lead of copper with gold, quality can be improved without any bending of fine lead 43 (FIG. 8). Moreover, like the method of the related art for forming a gold bump onto the fine lead of copper, since it is no longer required to form a bump 56 (FIG. 9), the time required to form the bump 56 can be saved to improve the manufacturing efficiency and the accuracy in the forming position of bump 56 never result in any problem. In addition, when the gold bump 56 is formed by the vacuum deposition method, gold may be used uneconomically but according to the embodiment of the present invention, gold is used efficiently to minimize the use thereof.

FIGS. 3A to 3G are cross-sectional views of each process in the method for manufacturing a lead frame in relation to the second embodiment of the present invention.

Figure 3A:
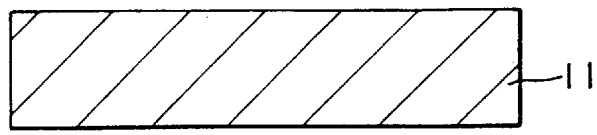
FIGS. 3A to 3G are process diagrams for explaining the method for manufacturing a lead frame in relation to the second embodiment of the present invention.
Figure 3B:
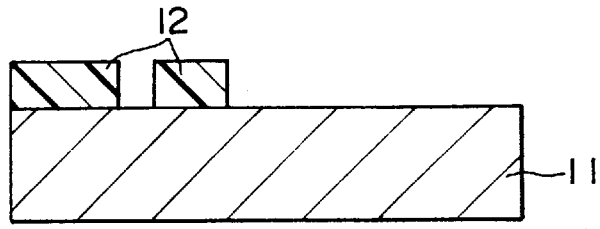

In the method in relation to this second embodiment, like the first embodiment as shown in FIGS. 3A and 3B, a copper plate 11 is prepared as the substrate and a pattern layer 12 is selectively formed on this copper plate 11.

Figure 3C:
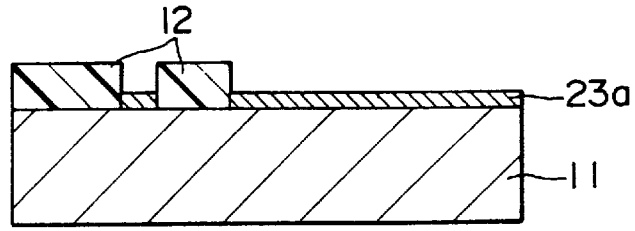
Figure 3D:
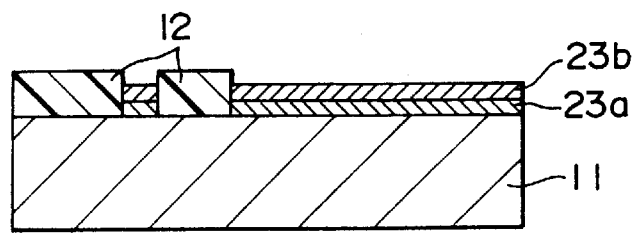

After formation of the pattern layer 12, like the first embodiment, the surface of the copper plate 11 in the side where the pattern layer 12 is formed is plated with gold using the pattern layer 12 as the mask to form a lower gold layer 23a in the thickness, for example, of 1 to 5 $\mu$m and thereafter this lower gold layer 23a is plated with copper to form the copper layer 23b in the thickness, for example, of 5 to 20 $\mu$m as shown in FIGS. 3C and 3D.

Figure 3E:
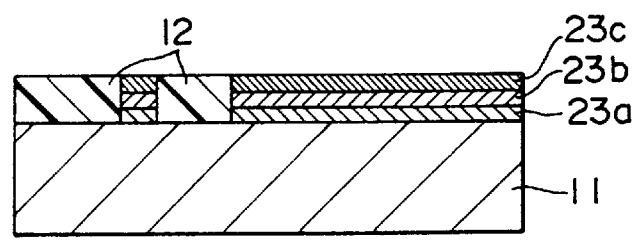

After formation of the copper layer 23b, in the same manner as forming the lower gold layer 23a, the copper layer 23b is plated with gold to form an upper gold layer 23c in the thickness, for example, of 0.1 to 5 $\mu$m in view of forming fine lead 23 consisting of three-layer structure of the lower gold layer 23a, copper layer 23b and upper gold layer 23c as shown in FIG. 3E.

Figure 3F:
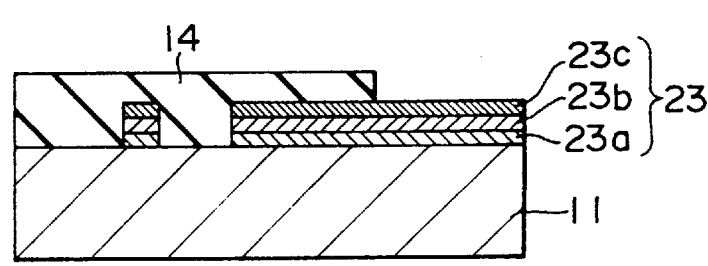

After formation of the upper gold layer 23c, the pattern layer 12 is removed like the first embodiment and thereafter the insulated resist film 14 is selectively formed except for the end part of the fine lead 23 as shown in FIG. 3F. Thereafter, like the first embodiment, the copper plate 11 is selectively etched. In this case, the lower gold layer 23a is used as the etching stop layer.

Figure 3G:
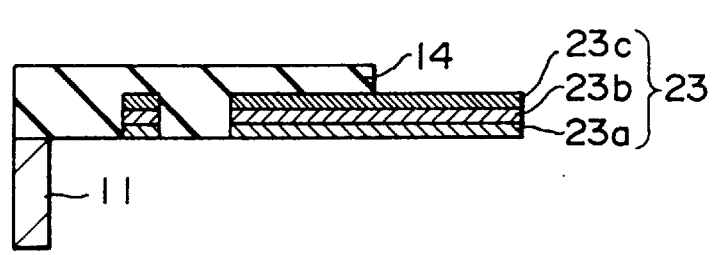

Thereby, as shown in FIG. 3G, the lead frame having the fine lead 23 of the three-layer structure where one surface is formed of the lower gold layer 23a, the other surface is formed of the upper gold layer 23c and the copper layer 13b is inserted between the upper gold layer 23a and lower gold layer 23c and being partly isolated electrically can be formed.

Figure 4:
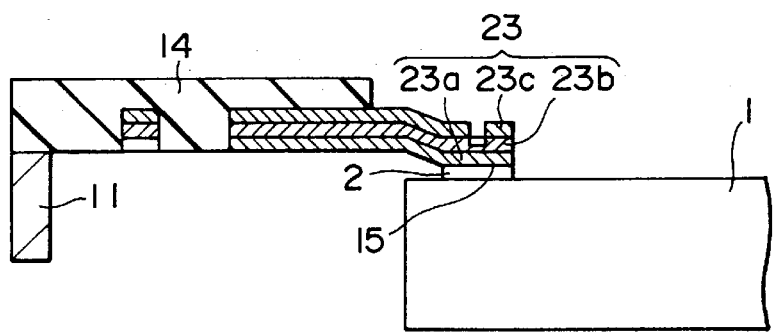
FIG. 4 is a cross-sectional view for explaining application condition of the lead frame manufactured by the method shown in FIG. 2.

The lead frame manufactured as explained above is placed and electrically connected, as shown in FIG. 4, to the electrode pad 2 provided on a semiconductor chip 1 at the connecting part 15 of the fine lead 23 with an ultrasonic tool or the like. In this case, the fine lead 23 is placed in contact with the electrode pad 2 at the lower gold layer 23*a*.

As described above, according to the method for manufacturing a lead frame in relation to this embodiment of the present invention, the surface of the copper plate 11 in the side where the pattern layer 12 is formed is plated with gold using the pattern layer 12 as the mask to form the lower gold layer 23*a* and thereafter the lower gold layer 23*a* is plated with copper to form the copper layer 23*b*. Moreover, the copper layer 23*b* is further plated with gold to form the upper gold layer 23*c*. Thereby, the fine lead 23 of the three-layer structure, where one surface is formed of the lower gold layer 23*a*, the other surface is formed of the upper gold layer 23*c* and the copper layer 23*b* is inserted between the upper gold layer 23*a* and lower gold layer 23*c*, can be formed easily. That is, the second embodiment has the effect similar to that of the first embodiment.

FIGS. 5A to 5E are cross-sectional views of each process in the method for manufacturing a lead frame in relation to the third embodiment of the present invention.

Figure 5A:
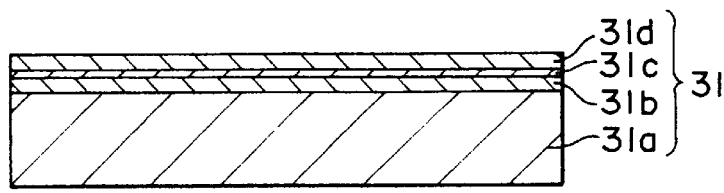
FIGS. 5A to 5E are process diagrams for explaining the method for manufacturing a lead frame in relation to the third embodiment of the present invention.

In the method in relation to this embodiment, an aluminum layer 31*b* is formed first, for example, in the thickness of 3 $\mu$m by the sputtering method on the copper plate 31*a*, for example, in the thickness of about 150 $\mu$m as shown in FIG. 5A. This aluminum layer 31*b* plays a role of the etching stop layer.

Figure 5B:
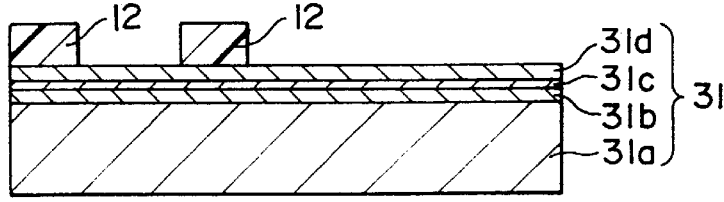

Next, as shown in FIG. 5B, a pattern layer 12 is selectively formed, as in the case of the first embodiment, on the substrate 31 (in more practical, on the nickel layer 31*d*).

Figure 5C:
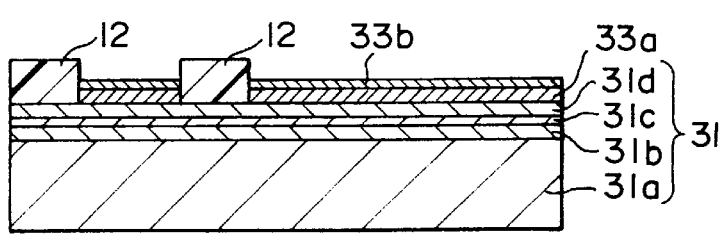

After formation of the pattern layer 12, the surface of the copper plate 11 in the side where the pattern layer 12 is formed is plated with gold using the pattern layer 12 as the mask to form a gold layer 33*a*, for example, in the thickness of 2 $\mu$m as shown in FIG. 5C. Thereafter, this gold layer 33*a* is plated with nickel to form a nickel layer 33*b*, for example, in the thickness of 1 $\mu$m. In this case, as the plating solution, the solution obtained by mixing the nickel sulfate of 300 g/l, nickel chloride of 30 g/l and boric acid of 40 g/l is used and a current density for electric plating is set to 2 A/dm$^2$. For instance, this nickel layer 33*b* is formed to enhance the junction strength between the gold layer 33*a* and copper layer 33*c* (refer to FIG. 5D) which will be explained later.

Figure 5D:
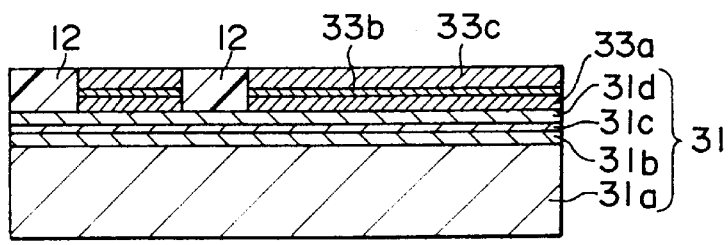

After formation of the nickel layer 23*b*, the nickel layer 33*b* is plated with copper as in the case of the first embodiment to form the copper layer 33*c*, for example, in the thickness of 15 $\mu$m as shown in FIG. 5D. Thereby, the fine lead 33, which has a three-layer structure joining the gold layer 33*a* and copper layer 33*c* with the nickel layer 33*b*, can be formed.

Figure 5E:
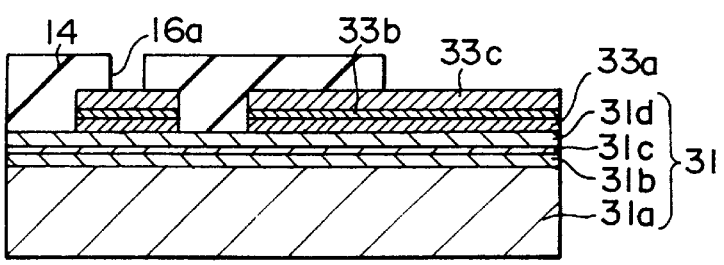
Figure 6A:
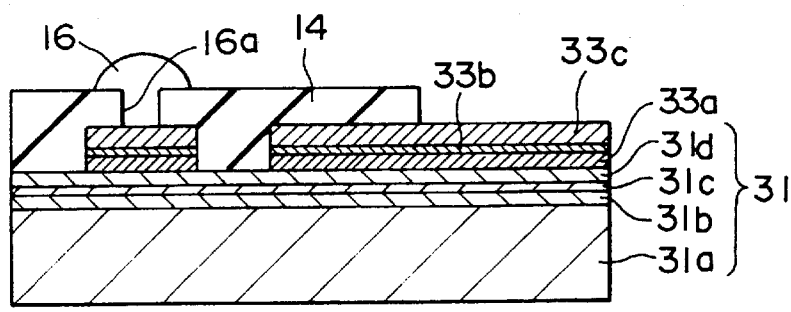
FIGS. 6A to 6C are process diagrams for explaining the subsequent processes of FIGS. 5A to 5E.

After formation of the copper layer 33*c*, the pattern layer 12 is removed as in the case of the first embodiment and subsequently an insulated resist film 14 is selectively formed except for the end part of fine lead 33 and a connecting hole 16*a* as shown in FIG. 5E. Thereafter, as shown in FIG. 6A, a conductive solder ball layer 16 is formed on the insulated resist film 14 and it is electrically connected to a gold layer 33*a* via the connecting hole 16*a*.

Figure 6B:
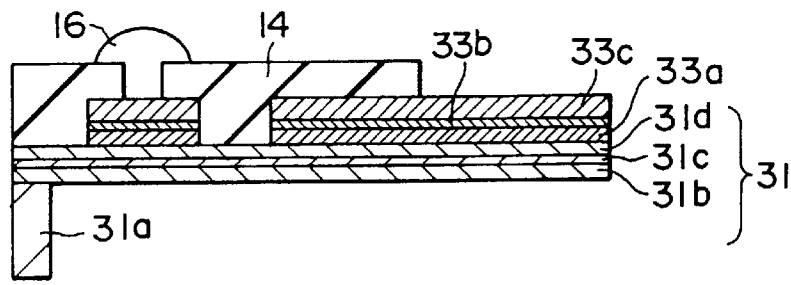

After formation of the solder ball layer 16, the copper plate 31*a* is selectively etched as in the case of the first embodiment as shown in FIG. 6B. In this case, the aluminum layer 31*b* plays a role of the etching stop layer.

Figure 6C:
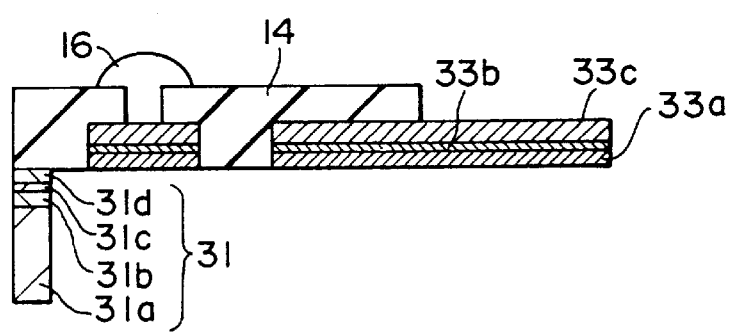

After the etching of the copper plate 31*a*, the aluminum layer 31*b*, chromium layer 31*c* and nickel layer 31*d* are sequentially and selectively etched as shown in FIG. 6C. In this etching process, for example, a mixed etching solution of hydrogen peroxide and sulfuric acid is used for etching of copper plate 31*a*, while the phosphoric acid based solution for etching of aluminum layer 31*b* and a mixed etching solution of hydrogen peroxide and hydrochloric acid for etching of nickel layer 31*d*. Since the chromium layer 31*c* is very thin, it is removed simultaneously with the nickel layer 31*d*. The gold layer 33*a* of the fine lead 33 works as the stop layer for etching of the nickel layer 31*d*.

Thereby, as shown in FIG. 6C, the lead frame having the fine lead 33 having a three-layer structure, where one surface is formed of the gold layer 33*a*, the other surface is formed of the copper layer 33*c* and this gold layer 33*a* and copper layer 33*c* is joined with the nickel layer 33*b*, can be formed.

Figure 7:
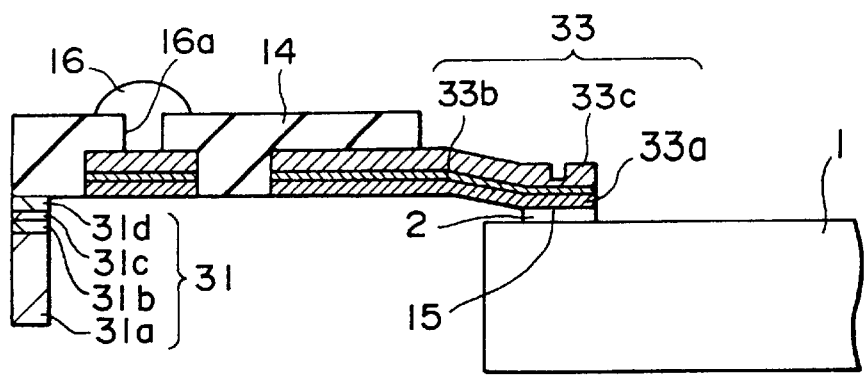
FIG. 7 is a cross-sectional view for explaining application condition of the lead frame manufactured by the method shown in FIGS. 5A to 5E.

The lead frame manufactured as explained above can be used, as shown in FIG. 7, in such a manner that the connecting portions 15 of the fine leads 33 are placed in contact and electrically connected with the electrode pads 2 of the semiconductor chip 1. In this case, the gold layers 33*a* of the fine leads 33 are placed in contact with the electrode pads 2.

According to the method for manufacturing a lead frame in relation to this embodiment as explained above, since a substrate 31 having formed the aluminum layer 31*b* as the etching stop on the copper plate 31*a* is used, a gold layer 33*a* is formed by plating, with gold, the surface of the substrate 31 in the side where the aluminum layer 31*b* is formed to form the gold layer 33*a* and thereafter the gold surface is then plated with copper to form the copper layer 33*c*, the fine lead 33 consisting of one surface formed of the gold layer 33*a* and the other surface formed of the copper layer 33*c* can be formed very easily by using the aluminum layer 31*b* as the etching stop layer. That is, the method of this embodiment can also provide the effect similar to that of the first embodiment.

The present invention has been explained above by referring to several embodiments thereof, but the present invention is not limited to such embodiments and also allows various changes or modifications. For example, the gold layers 13*a*, 23*a*, 23*c* of the fine leads 13, 23 and copper layers 13*b*, 23*b* are respectively joined in direct in the first and second embodiments, the joining layer such as nickel layer 33*b* may also be inserted between these gold and copper layers as in the case of the third embodiment.

Moreover, in the third embodiment, the nickel layer 31*d* is formed on the substrate 31, but the nickel layer 31*d* may be replaced with the copper layer.

In addition, in the third embodiment, the gold layer 33*a* is formed on the copper layer 33*c* is formed thereon at the time of forming the fine lead 33, but it is also possible that the copper layer is formed first on the substrate 31 and the gold layer is then formed thereon.

As explained above, according to the method for manufacturing a lead frame in relation to the present invention, since two or more layers are formed by sequentially plating the surface of the substrate where the pattern layer is formed with two or more kinds of metal material using the pattern layer as the mask, the fine lead having the layer structure of two or more layers can be formed very easily.

Therefore, the present invention provides the effect that quality can be improved because the fine lead is never bent unlike the method of the related art for plating the fine lead of copper with gold. Moreover, it is no longer necessary to form a bump (connecting electrode) unlike the method for forming bump of gold to the fine lead of copper in the related art and thereby the process to form a bump can be eliminated to improve the manufacturing efficiency and positional accuracy for formation of bump is never considered as a problem, resulting in the effect that the problem of accuracy can be eliminated. In addition, the present invention provides such an economical effect that gold may be used effectively and can be minimized in amount of use in comparison with the method of related art where gold bump is formed by the vacuum evaporation method.

What is claimed is:

1. A method for manufacturing a lead frame where fine leads are electrically connected with electrodes of a semiconductor chip and at least the fine leads electrically connected to the semiconductor chip have a structure with two or more layers, comprising:

forming a pattern layer to serve as a mask for metal plating on a substrate; and forming the two or more layers of said fine leads on a surface of the substrate where said pattern layer is formed by sequentially applying on said substrate two or more metal materials using the same pattern layer as the mask.

2. A method for manufacturing a lead frame as claimed in claim 1, further comprising:

removing said pattern layer after forming said fine lead and covering the region of said fine lead except for at least an electrical connecting portion with an insulated film; and selectively removing said substrate by etching using a layer, which is placed in direct contact with said substrate in said forming step among the two or more layers of said fine leads, as an etching stop layer.

3. A method for manufacturing a lead frame as claimed in claim 1, wherein said substrate has a layer structure having a plurality of layers, further comprising the steps of:

removing said pattern layer after formation of said fine lead and subsequently covering a region of said fine lead except for at least the electrical connecting portion with an insulated film;

selectively removing a part of said substrate by etching using one layer of said substrate as an etching stop layer; and selectively removing the layer used as said etching stop layer after selectively removing a part of said substrate.

4. A method for manufacturing a lead frame as claimed in claim 3, wherein said substrate a layer structure consisting of a plurality of layers where at least one or more layers are formed on a copper plate and at least one aluminum layer is included as the etching stop layer on the copper plate.

5. A method for manufacturing a lead frame as claimed in claim 3, wherein said fine lead has a layer structure of two or more layers in which one surface is formed of a copper layer and the other surface is formed of a gold layer, surface of said substrate is plated with copper to form a copper layer and the copper layer is further plated with gold to form a gold layer.

6. A method for manufacturing a lead frame as claimed in claim 1, wherein said fine lead has a layer structure of two or more layers where one surface is formed of a gold layer and the other surface is formed of a copper layer, the surface of said substrate is plated with gold to form a gold layer and the gold layer is then plated with copper to form a copper layer thereon.

7. A method for manufacturing a lead frame as claimed in claim 1, wherein said fine lead has a layer structure of three or more layers in which one surface is formed of a gold layer, the other surface is formed of a gold layer and a copper layer is inserted between these two gold layers, surface of said substrate is plated with gold to form a gold layer, the gold layer is plated with copper to form a copper layer and the copper layer is plated with gold to form a gold layer.

8. A method for manufacturing a semiconductor device wherein fine leads are electrically connected with electrodes of a semiconductor chip, comprising the steps of:

forming a pattern layer to-serve as a mask for metal plating on a substrate;

forming two or more layers on a surface of the substrate where said pat-tern layer is formed by sequentially applying on said substrate two or more metal materials using the same pattern layer as the mask to form the fine leads; and electrically connecting at least one of said fine leads and an electrode of a semiconductor chip.

9. The method as claimed in claim 8, wherein at least the fine leads electrically connected to the semiconductor chip have a structure with said two or more layers.

* * * * *

UNITED STATES PATENT AND TRADEMARK OFFICE
CERTIFICATE OF CORRECTION

PATENT NO. : 6,077,727
DATED : June 20, 2000
INVENTOR(S) : Osawa et al.

It is certified that error appears in the above-identified patent and that said Letters Patent is hereby corrected as shown below:

<u>Title page,</u>
Item [54], METHOD OF PRODUCING A LEAD FRAME HAVING A FINE LEAD DOUBLE-LAYER STRUCTURE <u>Column 8,</u>
Line 28 et seq., claim 8, line 1, should read;
8. A method for manufacturing a semiconductor device wherein fine leads are electrically connected with electrodes of a semiconductor chip, comprising the steps of:
forming a pattern layer to serve as a mask for metal plating on a substrate;

forming two or more layers on a surface of the substrate where said pattern layer is formed by sequentially applying on said substrate two or more metal materials using the same pattern layer as the mask to form the fine leads; and
electrically connecting at least one of said fine leads and an electrode of a semiconductor chip.

Signed and Sealed this

Thirteenth Day of November, 2001

Attest:

*Attesting Officer*

NICHOLAS P. GODICI
*Acting Director of the United States Patent and Trademark Office*